United States Patent
Kumala (10) Patent No.: US 6,880,144 B2
(45) Date of Patent: Apr. 12, 2005

(54) HIGH SPEED LOW POWER BITLINE

(75) Inventor: Effendy Kumala, Los Gatos, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 182 days.

(21) Appl. No.: 10/358,763

(22) Filed: Feb. 4, 2003

(65) Prior Publication Data

US 2004/0153976 A1 Aug. 5, 2004

(51) Int. Cl.⁷ .................... G06F 17/50; G06F 13/40; H01L 25/00; H03K 17/16; H03K 19/003; G11C 7/08; G11C 7/12; H03L 5/00
(52) U.S. Cl. ................. 716/9; 716/10; 716/13; 716/14; 326/33; 326/41; 326/47; 326/101; 327/51; 327/309; 327/321; 365/185.13; 711/102; 711/104; 711/118
(58) Field of Search .............. 716/9, 10, 13, 716/14; 326/33, 41, 47, 101; 327/51, 309, 321; 365/185.13; 711/102, 104, 118

(56) References Cited

U.S. PATENT DOCUMENTS

| | | | | |
|---|---|---|---|---|
| 5,140,192 A | * | 8/1992 | Nogle | 326/110 |
| 5,155,392 A | * | 10/1992 | Nogle | 326/84 |
| 5,155,703 A | * | 10/1992 | Nogle | 365/190 |
| 5,229,967 A | * | 7/1993 | Nogle et al. | 365/208 |
| 5,696,717 A | * | 12/1997 | Koh | 365/185.22 |
| 6,469,929 B1 | * | 10/2002 | Kushnarenko et al. | 365/185.06 |
| 6,492,844 B2 | * | 12/2002 | Terzioglu et al. | 327/52 |
| 6,535,025 B2 | * | 3/2003 | Terzioglu et al. | 327/51 |
| 6,710,628 B2 | * | 3/2004 | Afghahi et al. | 327/52 |
| 6,781,421 B2 | * | 8/2004 | Terzioglu et al. | 327/51 |
| 2001/0033184 A1 | * | 10/2001 | Terzioglu et al. | 327/51 |
| 2003/0026145 A1 | * | 2/2003 | Lee | 365/200 |
| 2003/0043623 A1 | * | 3/2003 | Shimbayashi et al. | 365/185.05 |
| 2003/0107408 A1 | * | 6/2003 | Afghahi et al. | 327/52 |
| 2003/0173998 A1 | * | 9/2003 | Terzioglu et al. | 327/51 |
| 2004/0057285 A1 | * | 3/2004 | Cernea et al. | 365/185.12 |
| 2004/0169529 A1 | * | 9/2004 | Afghahi et al. | 327/51 |

OTHER PUBLICATIONS

Dhang et al., "High–speed sensing scheme for CMOS DRAMS", IEEE Journal of Solid–State Circuits, vol. 23, No. 1, Feb. 1988, pp. 34–40.*

(Continued)

Primary Examiner—Matthew Smith
Assistant Examiner—Phallaka Kik
(74) Attorney, Agent, or Firm—Martine Penilla & Gencarella, LLP (57) ABSTRACT

A circuit for controlling a bitline during a memory access operation is provided. The circuit includes a plurality of sub-arrays with each sub-array having a plurality of memory cells. Each of the memory cells is coupled to respective bitline columns. The circuit further includes a sensed output from one of the bitline columns, and a global bitline coupled to a same respective bitline column of each of the plurality of sub-arrays. Each global bitline includes a voltage swing limiter for limiting a voltage swing of the global bitline, and an n-type transistor. The n-type transistor has a gate, a first terminal, and a second terminal. The gate is coupled to the sensed output, the first terminal is coupled to the global bitline, and the second terminal is coupled to the voltage swing limiter.

20 Claims, 7 Drawing Sheets

OTHER PUBLICATIONS

Nambu et al., "A 550–ps access 900–MHz 1–Mb ECL–CMOS SRAM", IEEE Journal of Solid–State Circuits, vol. 35, No. 8, Aug. 2000, pp. 1159–1168.*

Mizuno et al., "Driving source–line cell architecture for sub–a–v high–speed low–power applications", IEEE Journal of Solid–State Circuits, vol. 31, No. 4, Apr. 1996, pp. 552–557.*

Izumikawa et al., "A current direction sense technique for multiport SRAM's", IEEE Journal of Solid–State Circuits, vol. 31, No. Apr. 1996, pp. 546–551.*

Miyamoto et al., "A high–speed 64K CMOS RAM with bipolar sense amplifiers", IEEE Journal of Solid–State Circuits, vol. 19, N 5, Oct. 1984, pp. 557–563.*

NN8808289, "Complementary Referencing for Dynamic Array Sensing", IBM Technical Disclosure Bulletin, vol. 31, No. 3, Aug. 1988, pp. 289–290 (3 pages).*

NN8810327, "Multiple–Stage Sensing Method for Embedded Memory", IBM Technical Disclosure Bulletin, vol. 31, No. 5, Oct. 1988, pp. 327–328 (4 pages).*

Chi (Patent No. TW 368655 A, Published Sep. 1, 1999, abstract only).*

* cited by examiner

HIGH SPEED LOW POWER BITLINE

BACKGROUND OF THE INVENTION

1. Field of the Invention

The present invention relates generally to semiconductor circuits implemented in computer memory, and more specifically to circuit design for bitline circuitry of large cache memory blocks.

2. Description of the Related Art

Figure 1A:
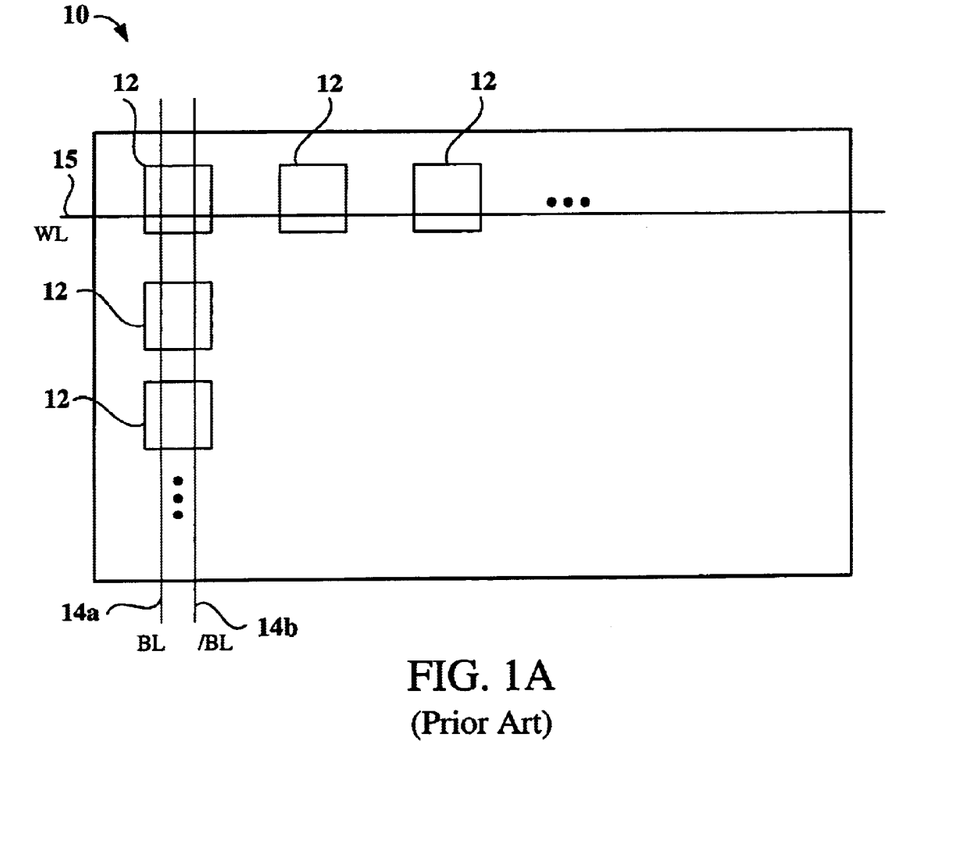
FIG. 1A shows a representative layout of a cache memory block.

In large cache memory blocks, generally defined as memory of 64 kilobytes or larger, a plurality of memory cells are arrayed and connected by bitlines and wordlines. FIG. 1A shows a representative layout of a cache memory block 10. A plurality of memory cells 12 are defined in an array or grid, and individual memory cells 12 are connected along columns by a pair of bitlines known as a bitline (BL) 14a and inverse bitline (/BL) 14b. Individual memory cells 12 are connected along rows by wordlines (WL) 15.

As larger and larger cache memory blocks are implemented, e.g., large cache memory blocks, the number of memory cells 12 that can be supported by a WL 15 and by BL 14a and /BL 14b is limited by such factors as power consumption, performance, and the like. By way of example, when memory cells 12 are switching, circuits are charged and discharged along a common BL 14a and /BL 14b, requiring increased power with increasing numbers of memory cells 12, and decreasing the switching speed. In order to support the increased number of memory cells 12 of large cache memory, a common design is to sub-divide the memory cells 12 and utilize local circuitry for the sub-array memory cells that will tie in to global circuitry to support the entire large cache memory block.

Figure 1B:
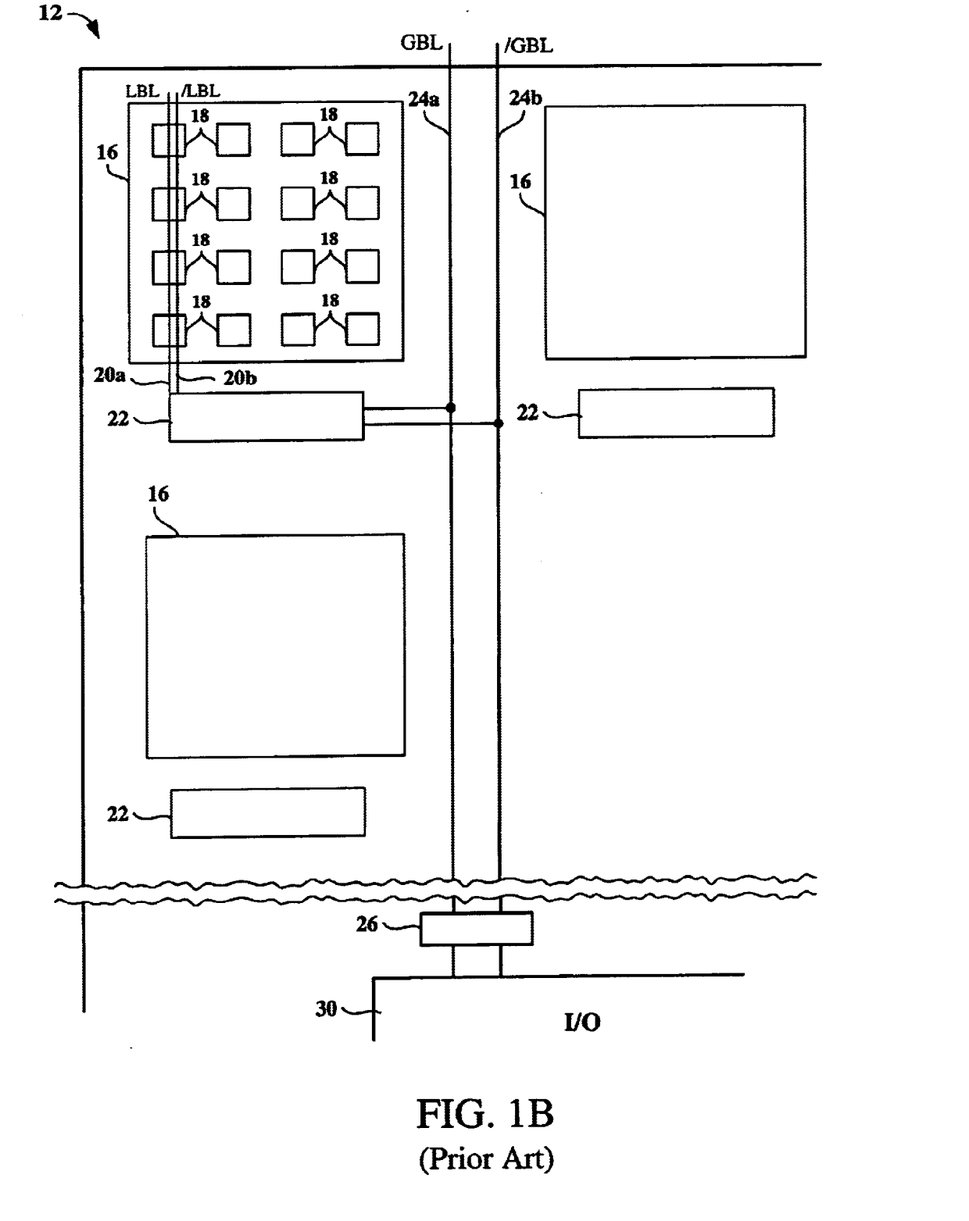
FIG. 1B shows a partial view of a sub-array or partitioning of a memory cell.

FIG. 1B shows a partial view of a sub-array or partitioning of a memory cell 12. Sub-blocks 16 include a plurality of sub-cells 18 joined by local bitline pairs shown as local bit line (LBL) 20a and local inverse bitline (/LBL) 20b. A local sense amp, also known as a first stage sense amp, is located in block 22 which receives and transmits the signals received from the local bitline pairs, e.g., LBL 20a and /LBL 20b, to global bitline pairs shown as global bitline (GBL) 24a and global inverse bitline (/GBL) 24b. GBL 24a and /GBL 24b transmit the received signals from the plurality of sub-blocks 16 through a second stage sense amp 26 to an input/output (I/O) shown in block 30.

In the conventional design as illustrated in FIG. 1B, block 22 containing a local sense amp to capture the signals from LBL 20a and /LBL 20b and to transmit the signals through GBL 24a and /GBL 24b to I/O 30 may also include buffers and drivers to move the full swing to I/O 30. Drivers typically perform a full swing from 0V–1.1V (assuming supply voltage=1.1V), and the reverse, consuming a great deal power, and the longer the line, GBL 24a and /GBL 24b, the greater capacitance exists to charge and discharge. Further, large drivers require precious circuit space. Finally, switching in an increasing plurality of lines generates a lot of noise. By way of example, 2500 lines may be switching in a large cache memory block with associated voltage swings in local sense amps and drivers, transmitted through a plurality of global bitline pairs, consuming a great deal of current from the power supply and impacting performance of other parts of the CPU.

Figure 1C:
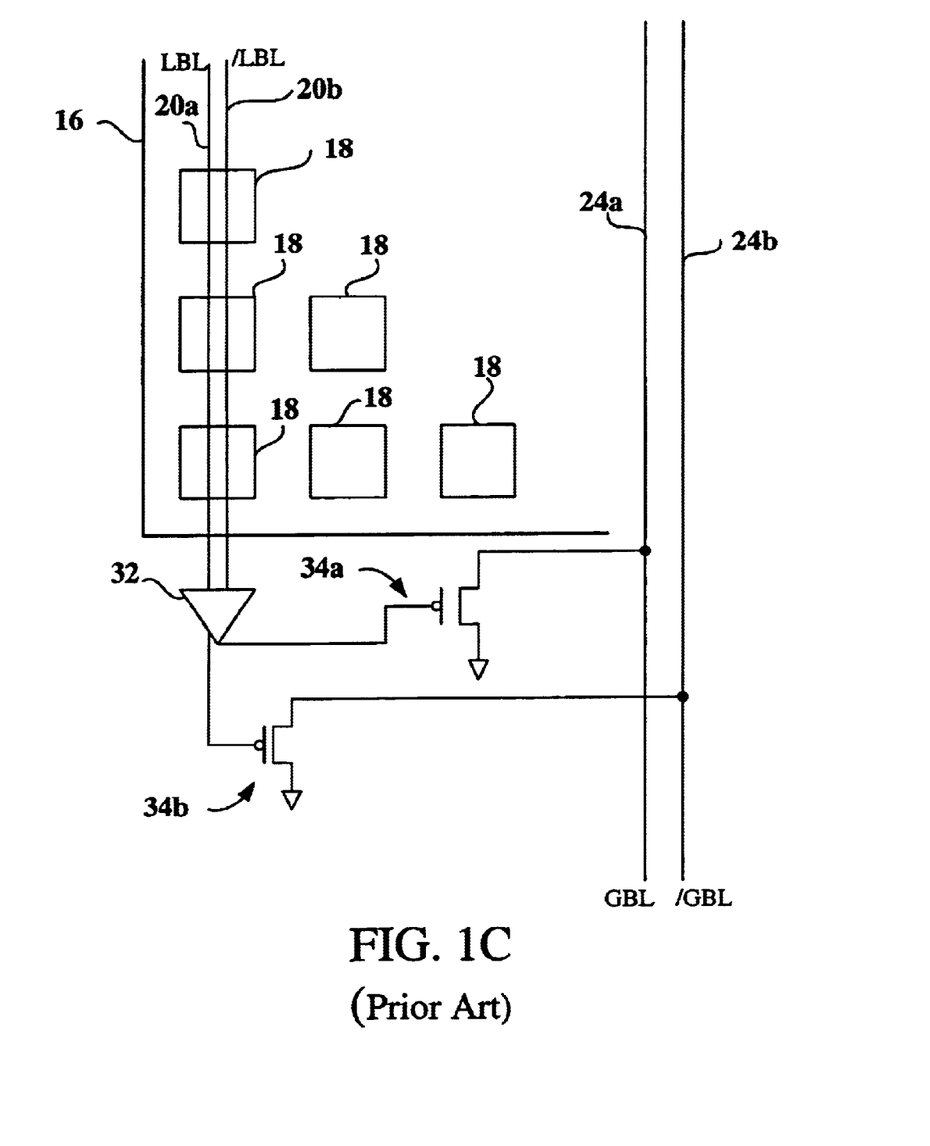
FIG. 1C shows a detail view of a partial sub-block with associated local sense amp and p-type devices in a typical implementation.

One attempt in prior art to reduce power consumption, area requirements, and noise has been to use a local sense amp to drive the PMOS, hereinafter referred to as p-type, devices to pull down precharged high global bit lines, generating limited voltage swing, and use a second stage amp 26 to generate full swing signals at I/O 30. FIG. 1C shows a detail view of a partial sub-block 16 with associated local sense amp 32 and p-type devices 34a, 34b in a typical implementation. As illustrated, a plurality of sub-cells 18 are joined along local bitline pairs LBL 20a and /LBL 20b, and a local sense amp 32 feeds through a pair of p-type devices 34a and 34b respectively to GBL 24a and /GBL 24b. In such a configuration, power consumption is reduced due to limited swing signals, required area is minimized, and noise is decreased with small drivers. However, while a p-type device is good at pull-up, it is not a good pull-down device. As is known, a property of the p-type device is that it will not pull down the voltage to zero, but is instead limited to the p-threshold of approximately 0.35V–0.4V, depending on the technology used. Further, and perhaps more importantly, the speed of the pull-down is inadequate for the desired performance characteristics of large cache memory.

In light of the foregoing, it is desired to implement a circuit design that will limit the voltage swing at the local sense amp and increase switching speed while maintaining a minimum of noise and area requirements.

SUMMARY OF THE INVENTION

Broadly speaking, the present invention fills these needs by providing a circuit for large cache memory with high speed and low power consumption. The present invention can be implemented in numerous ways, including as a process, an apparatus, a system, a device, or a method. Several embodiments of the present invention are described below.

In one embodiment, a circuit for controlling a bitline during a memory access operation is disclosed. The circuit includes a plurality of sub-arrays with each sub-array having a plurality of memory cells. Each of the memory cells is coupled to respective bitline columns. A sensed output from one of the bitline columns is provided, and a global bitline is coupled to a same respective bitline column of each of the plurality of sub-arrays. Each global bitline includes a voltage swing limiter for limiting a voltage swing of the global bitline, and an n-type transistor. The n-type transistor has a gate, a first terminal, and a second terminal. The gate is coupled to the sensed output, the first terminal is coupled to the global bitline, and the second terminal is coupled to the voltage swing limiter.

In another embodiment, a circuit for transmitting signals of a bitline during a memory access operation is disclosed. The circuit includes a plurality of sub-arrays of a cache memory block, and each sub-array has a plurality of sub-cells of memory. Each of the sub-cells of memory is coupled to respective local bitline columns. A sensed output is transmitted through a local sense amp from one of the local bitline columns, and a global bitline is coupled to a same respective local bitline column of each of the plurality of sub-arrays. Each global bitline includes a voltage swing limiter for limiting a voltage swing of the global bitline, and an n-type transistor. The n-type transistor has a gate, a first terminal, and a second terminal. The gate is coupled to the sensed output, the first terminal is coupled to the global bitline, and the second terminal is coupled to the voltage swing limiter.

In still a further embodiment, a circuit design for signal transmission in a large cache memory block is disclosed. The large cache memory block is sub-divided into a plurality of sub-arrays, and each of the sub-arrays includes a plurality of sub-cells of memory. The circuit design includes local bitline columns coupled to the plurality of sub-cells of memory, and local sensed output from the local bitline columns. An n-type transistor having a gate, a first terminal, and a second terminal is described, and a global bitline is coupled to the local sensed output through the n-type transistor. A voltage swing limiter is coupled between the n-type transistor, the global bitline, and ground. The gate of the n-type transistor is coupled to the local sensed output, the first terminal of the n-type transistor is coupled to the global bitline, and the second terminal of the n-type transistor is coupled to the voltage swing limiter.

Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

An invention for circuit design for sub-arrays to global-bitlines/read-data-bus is disclosed. In preferred embodiments, the circuit design includes implementing n-type devices and a voltage limiter to limit voltage swing and improve speed and performance. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2:
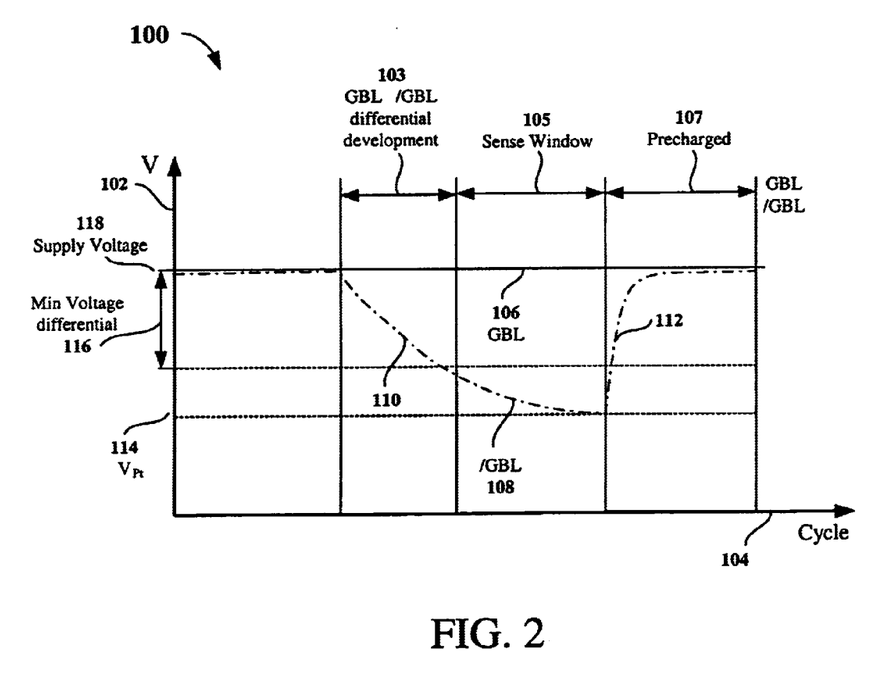
FIG. 2 shows a graph highlighting the performance of the p-type device as a pull-down in sub-array block circuitry.

As described above in reference to prior art, circuitry currently implemented connecting sub-array blocks to global bitline pairs of large cache memory uses p-type devices as pull-down devices. FIG. 2 shows a graph 100 highlighting the performance of the p-type device as a pull-down in sub-array block circuitry. Graph 100 plots voltage 102 along cycle time 104. GBL 106 and /GBL 108 begin pre-charged high to a supply voltage value. At timing window, illustrated as GBL and /GBL differential development window 103, /GBL 108 is pulled down to a voltage value that produces the minimum voltage differential 116 needed by the sense amplifier. At sense timing window 105, /GBL 108 is continuously pulled down to and approaching the threshold for the p-type device, denoted $V_{Pt}$, and shown by line 114. It should be noted that this value is greater than zero, and is typicaly about 0.35V–0.4V. An advantage to this device is that somewhat less than full voltage swing is realized, which reduces power consumption as well as noise. However, as described above, p-type devices are not the most efficient pull-down devices, although a good pull-up device. In FIG. 2, slope 110 illustrates the deficiency of a p-type device implemented as a pull-down device. As /GBL 108 is pulled down approaching $V_{Pt}$, the p-type device pull down capabilities weaken tremendously. The p-type pull down deficiency becomes more apparent when the supply voltage operation is lowered, resulting in differential voltage development window 103 widening more than others, thus serving as a limiter of the cyle time. Slope 112 shows the device has a rapid pull-up response almost completely up to the supply voltage.

As is known, n-type devices are superior to p-type devices as pull-down devices. However, with a path to ground, an n-type device is typically a full swing device, and unless limited, would result in no power savings, in no noise reduction, or other desired advantages. Embodiments of the present invention exploit the superior performance of the n-type transistor, and along with a voltage swing limiter, realize increased switching speed, reduced power consumption, reduced noise, and a superior large cache memory block circuit.

Figure 3A:
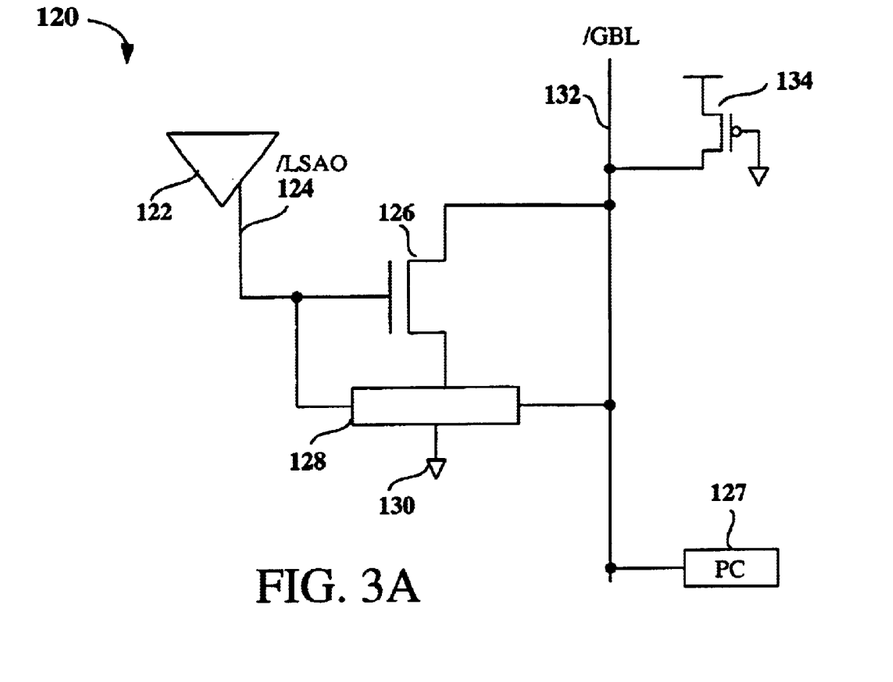
FIG. 3A shows a circuit design between a local sense amp of a sub-array of a large cache memory block, and one of a pair of global bitlines in accordance with one embodiment of the present invention.

FIG. 3A shows a circuit design 120 between a local sense amp 122 of a sub-array of a large cache memory block, and one of a pair of global bitlines, /GBL 132, in accordance with one embodiment of the present invention. For ease of illustration and understanding, only one of the pair of local sense amp outputs, /LSAO 124, and only one of the pair of global bitlines, /GBL 132 is shown. Typically, bitlines, or bitline columns, can include a single bitline, or a pair of bitlines for differential reading and access. As shown in FIG. 3A, /LSAO 124, as output from local sense amp 122, is connected to the gate of the n-type device 126 from which its drain node is tied to /GBL 132. /GBL 132 is pre-charged high to supply voltage by pre-charger 127. Before traveling to ground 130, one terminal of n-type device 126 travels through a voltage swing limiter 128, which in one embodiment is also tied to /GBL 132 and to local sense amp ouput /LSAO.

Also shown in FIG. 3A is a p-type transistor functioning as a pull-up keeper 134 along /GBL 132. Pull-up keeper 134, in one embodiment, off-sets one or more leaker transistors functioning within voltage swing limiter 128 and described in more detail below. One or more pull-up keeper devices can be configured at I/O (see FIG. 1B) as well, and are not illustrated in FIG. 3A.

Figure 3B:
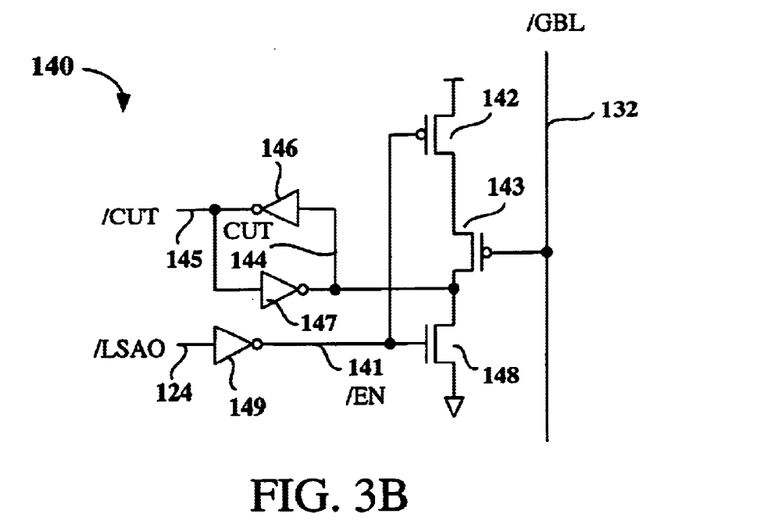
FIG. 3B illustrates a voltage swing detection circuit, which is part of voltage swing limiter in accordance with one embodiment of the invention.

FIG. 3B illustrates a voltage swing detection circuit 140, which is part of voltage swing limiter 128 in accordance with one embodiment of the invention. As shown in FIG. 3B, the voltage swing detection circuit 140 includes p-type device 142 that functions as a switch to enable/disable the detection circuit. In one embodiment, /GBL 132 is precharged high and the signal output from the local sense amp 122 (see FIG. 3A), /LSAO 124, is initially low. At this point, the detection circuit is disabled. The net /EN 141, the output of inverter 149, is high, the reset n-type device 148 is turned on, net CUT 144 is low and /CUT is high. Therefore, the path of the n-type device 126 (see FIG. 3A) to ground is on. Next, when the sense amp output /LSAO 124 switches to high, n-type device 126 discharges the precharged high /GBL 132. In addition to turning on the n-type device 126, the /LSAO 124 high also causes net /EN 141, the output of the inverter 149, to go low, turning on the p-type device 142, thereby activating the voltage detection circuit. In order to limit the /GBL 132 voltage swing, p-type device 143, p-type device 142, n-type device of inverter 147 and the ratio of p-type transistor to the n-type transistor of inverter 146 are all sized such that they define the desired low point of the /GBL 132 signal swing. As the /GBL 132 is pulled down past the threshold voltage of the p-type device 143, net CUT 144 is pulled high and flips the inverter 146 output, net /CUT 145, switching from high to low which essentially stops the n-type device 126 from pulling down the /GBL 132 any further. In this manner, the speed of the n-type device 126 (see FIG. 3A) is exploited while achieving power consumption savings, as well as reduced noise, by maintaining a low voltage swing. When the output of the local sense amp /LSAO 124 is precharged back to low, net /EN 141 switches back to high, turning on n-type device 148 which resets net CUT 144 to low, and sets net /CUT 145 to high. It should be noted here that the inverter 147 is a weak inverter which can be overdriven by n-type device 148 or by the two stacked p-type devices 142, 143.

Figure 4:
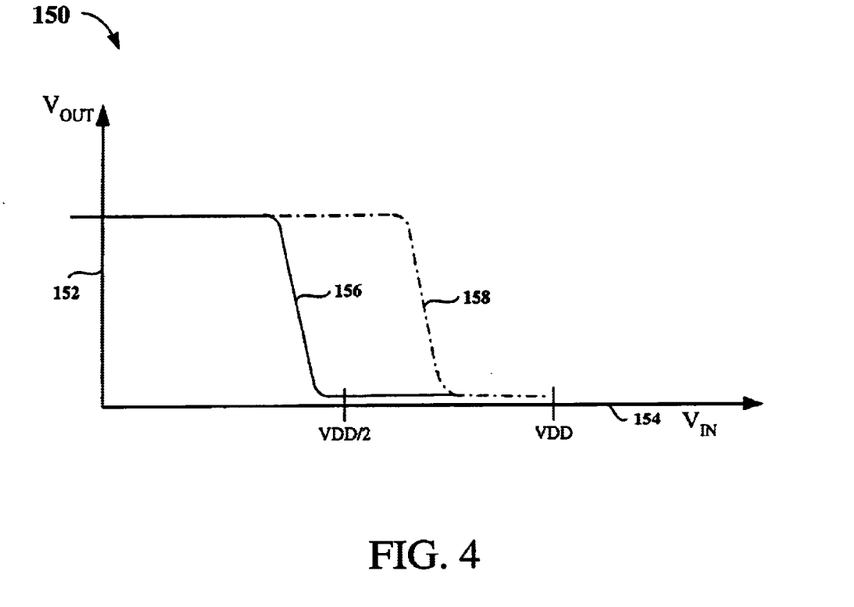
FIG. 4 is a graph of $V_{OUT}$ verses $V_{IN}$ showing variation in switching values achieved with varying the transistor ratios in accordance with one embodiment of the invention.

FIG. 4 is a graph 150 of $V_{OUT}$ 150 verses $V_{IN}$ 154 showing variation in switching values achieved with varying the transistor ratios in accordance with one embodiment of the invention. When the ratio of both of the combined p-type transistors 142, 143 (see FIG. 3B) to the n-type transistor of the inverter 147 is increased, and the ratio of n-type device to p-type device of inverter 146 in voltage swing detection circuit 140 (see FIG. 3B) is also increased, switching occurs at smaller signal swing, as illustrated by plot 158 on graph 150. When the ratio of both of the above devices are decreased, the switching occurs at a larger signal swing as illustrated by plot 156 on graph 150. Therefore, in accordance with one embodiment of the present invention, a tuning window for voltage swing can be established by varying the ratio of the transistor sizes of p-type devices 142, 143, the n-type device of the inverter 147, and the ratio of transistor sizes in inverter 146 (see FIG. 3B) in accordance with the performance characteristics and technology implemented for any particular application.

Turning again to FIG. 3A, voltage swing limiter 128 serves to pull down the voltage to a value of approximately $V_{supply}/2$, in one embodiment. One or more devices can also be implemented as leaker transistors within voltage swing limiter 128, as is described and illustrated below in FIG. 6. As is known, leaker transistors are used to maintain the desired voltage and prevent the voltage from creeping upwards from a desired value to the pre-charged value on /GBL 132. Further, to off-set or compensate for the leaker transistor(s), one or more voltage keepers 134 (see FIG. 3A), p-type devices in one embodiment, are implemented along /GBL 132, and at I/O 30 (see FIG. 1B).

Figure 5:
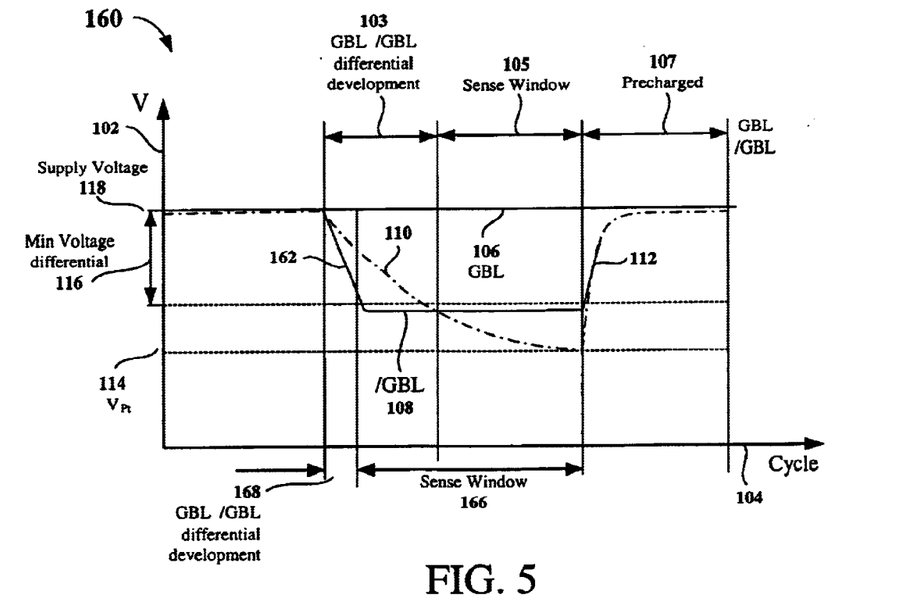
FIG. 5 is a graph illustrating the advantages obtained with the design as described in accordance with one embodiment of the invention.

FIG. 5 is a graph 160 illustrating the advantages obtained with the design as described in accordance with one embodiment of the invention. In FIG. 5, voltage V 102 is plotted against cycle time 104. GBL 106 and /GBL 108 are shown beginning at a pre-charged value of supply voltage 118, approximately 1.1V. At sense window 166, /GBL 108 is pulled down to approximately one half of the supply voltage 118. The pull-down slope 162 is illustrated as much steeper, and therefore much faster, than that achieved with prior art designs. An exemplary p-type device slope 110 is provided for comparison. Further, GBL, /GBL voltage differential development window 168 is much smaller than that achieved with prior art design (shown as GBL, /GBL differential development window 103), which results in shorter cycle time.

Figure 6:
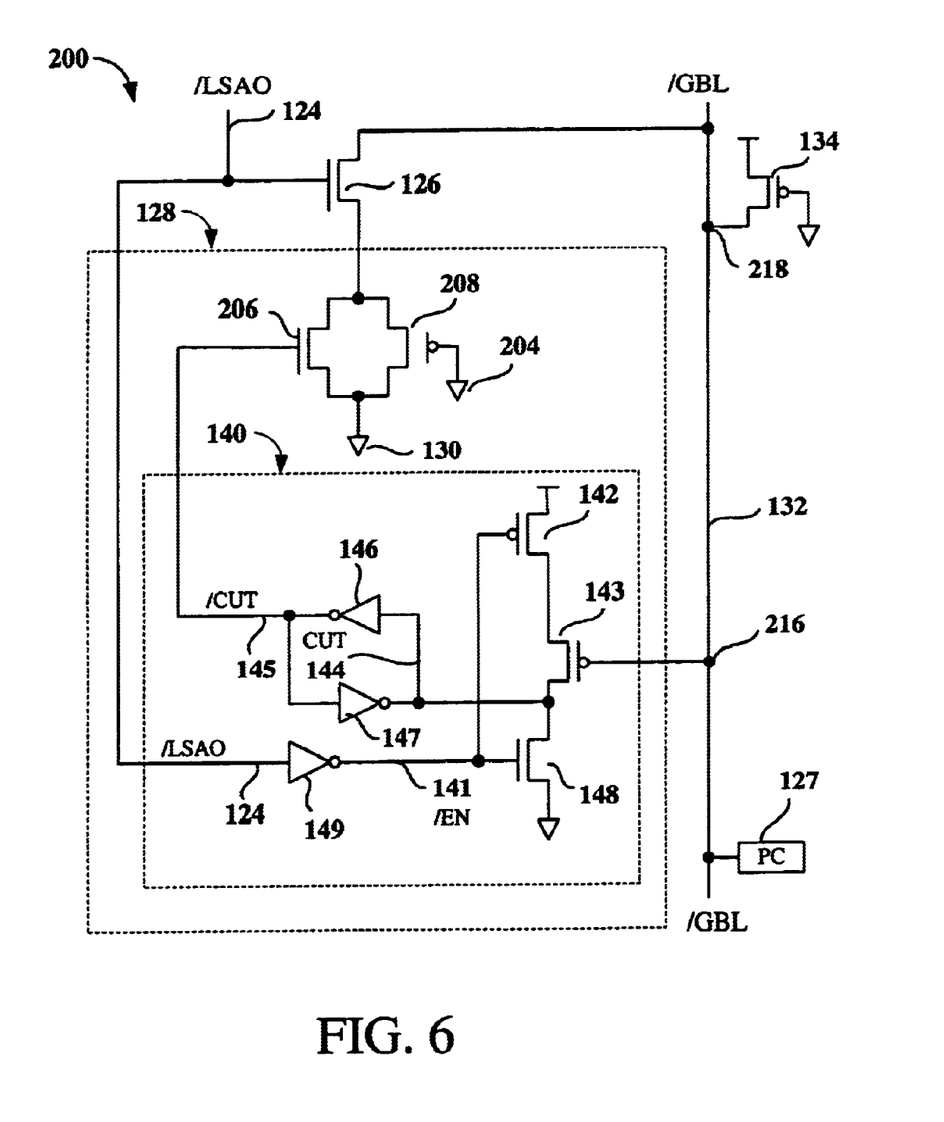
FIG. 6 shows a circuit design for a sub-array block of large cache memory in accordance with one embodiment of the present invention.

FIG. 6 shows a circuit design 200 for a sub-array block of large cache memory in accordance with one embodiment of the present invention. For ease of illustration and understanding, only one local sense amp output and one global bitline are illustrated, but it should be understood that embodiments of the present invention are applicable to differential applications, and therefore pairs of bitlines, as well as single bitlines. In one embodiment, the illustrated circuit design 200 is essentially identical in the second of a pair of bitlines, if included in the cache memory block. Bitlines, therefore, can be said to be provided in bitline columns having a single bitline or a pair of bitlines.

As shown in FIG. 6, /LSAO 124 is output from a local sense amp (not shown) and feeds to n-type device 126, as well as to inverter 149, contained within voltage swing limiter 128. N-type device 126 ties to /GBL 132, and to voltage swing limiter 128. N-type transistor 206 is driven by inverter 146 output and to ground 130, and is tied to p-type transistor 208 which goes to ground at 130 and 204. The output of inverter 149 goes to p-type device 142 and to n-type device 148. The p-type device 143 is tied to /GBL 132, p-type device 142 and n-type device 148. The common net of p-type device 143 and n-type device 148, net CUT 144, is tied to the output of inverter 147 and to the input of inverter 146. The output of inverter 146 is also tied to the input of inverter 147. /GBL 132 is pre-charged high by pre-charger 127, and an exemplary pull-up keeper 134 is illustrated tied to /GBL 132.

In accordance with one embodiment of the invention, initially the output of the local sense amp /LSAO 124 is set to low forcing the output of inverter 149 to high which turns on n-type device 148 and turns off p-type device 142 resulting in net CUT 144 being reset to low, and net /CUT 145 set to high. Therefore, a high signal is transmitted to activate n-type device 206, opening path to ground 130. When an active high signal is asserted by /LSAO 124, the active high travels to n-type device 126 and to the input of inverter 149. N-type device 126 is activated by active high signal /LSAO 124, and the /GBL 132, which is initially precharged to $V_{supply}$, is pulled down low. The assertion of /LSAO 124 to a high signal causes the output of inverter 149, net /EN 141, to flip to low, to turn off n-type device 148, and to turn on p-type device 142, activating the voltage swing detection circuit 140. When the /GBL 132 is pulled down to approximately $V_{supply}/2$, tunable as desired as described above, p-type device 143 is turned on, and turned on strong enough to pull up the net CUT 144, passing the input trigger voltage needed to flip inverter 146 output, net /CUT 145, to a low level signal. The low signal travels to n-type device 206, cutting off the primary discharging path through n-type device 206, thereby limiting the swing of the /GBL 132 signal. As the local sense amp output /LSAO 124 is reset to low, the low signal turns off the n-type device 126 and flips the output of inverter 149, net /EN 141, to high to activate n-type device 148 and de-activate p-type device 142. This will unconditionally reset net CUT 144 to low and net /CUT 145 to high, activating n-type device 126. Voltage pull-down leaker 208, and pull-up keeper 134, are provided in one embodiment to maintain an essentially constant voltage at high or low as appropriate.

In summary, the present invention provides a circuit design for large cache memory blocks implementing an n-type device with a voltage swing limiter at the sub-array block level. The described circuit design achieves increased speed over prior art while minimizing power consumption, noise, and required area for implementation. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims and equivalents thereof.

What is claimed is:

1. A circuit for controlling a bitline during a memory access operation, comprising:
    a plurality of sub-arrays, each sub-array having a plurality of memory cells, each of the memory cells being coupled to respective bitline columns;
    a sensed output from one of the bitline columns;
    a global bitline being coupled to a same respective bitline column of each of the plurality of sub-arrays, each global bitline including,
        a voltage swing limiter for limiting a voltage swing of the global bitline; and
        an n-type transistor having a gate, a first terminal, and a second terminal, wherein the gate is coupled to the sensed output, the first terminal is coupled to the global bitline, and the second terminal is coupled to the voltage swing limiter.

2. The circuit of claim 1, wherein the voltage swing limiter includes a voltage swing detection circuit.

3. The circuit of claim 2, wherein the voltage swing detection circuit includes two p-type devices, an n-type device, and two cross-coupled inverters.

4. The circuit of claim 3, wherein the voltage swing detection circuit includes an inverter.

5. The circuit of claim 4, wherein the two p-type devices are stacked and the voltage swing detection circuit includes a ratio of the two stacked p-type devices to an n-type transistor of the inverter to define a degree of the voltage swing.

6. The circuit of claim 1, wherein the bitline columns include one of a single bitline and a pair of differential bitlines.

7. The circuit of claim 1, wherein the voltage swing limiter includes a transmission gate having a p-type device and an n-type device, the n-type device having a first terminal and a second terminal and being coupled between ground and the second terminal.

8. The circuit of claim 7, wherein the global bitline includes a pull-up keeper p-type device coupled thereto.

9. The circuit of claim 1, wherein the circuit is configured to a large cache memory block.

10. A circuit for transmitting signals of a bitline during a memory access operation, comprising:
    a plurality of sub-arrays of a cache memory block, each sub-array having a plurality of sub-cells of memory, each of the sub-cells of memory being coupled to respective local bitline columns;
    a sensed output transmitted through a local sense amp from one of the local bitline columns;
    a global bitline being coupled to a same respective local bitline column of each of the plurality of sub-arrays, each global bitline including,
        a voltage swing limiter for limiting a voltage swing of the global bitline; and
        an n-type transistor having a gate, a first terminal, and a second terminal, wherein the gate is coupled to the sensed output, the first terminal is coupled to the global bitline, and the second terminal is coupled to the voltage swing limiter.

11. The circuit of claim 10, wherein the voltage swing limiter includes a voltage swing detection circuit defining an amount of voltage swing.

12. The circuit of claim 11, wherein the voltage swing detection circuit includes a pair of stacked p-type devices and an inverter having an output connected one of the pair of stacked p-type devices, and a ratio of the pair of stacked p-type devices to an n-type transistor of the inverter controls the voltage swing.

13. The circuit of claim 12, wherein an input of the inverter is connected to the pair of stacked p-typed devices and a ratio of the pair of stacked p-type devices to the n-type transistor of the inverter controls the voltage swing.

14. The circuit of claim 10, wherein the local bitline columns include one of a single bitline and a pair of differential bitlines.

15. The circuit of claim 10, wherein the voltage swing limiter includes a transmission gate having a p-type device and an n-type device, the n-type device having a first terminal and a second terminal and being coupled between ground and the second terminal.

16. The circuit of claim 10, wherein the circuit is configured to a large cache memory block.

17. A circuit design for signal transmission in a large cache memory block, the large cache memory block being sub-divided into a plurality of sub-arrays, each of the sub-arrays including a plurality of sub-cells of memory, comprising:
    local bitline columns coupled to the plurality of sub-cells of memory;
    local sensed output from the local bitline columns;
    an n-type transistor having a gate, a first terminal, and a second terminal;
    a global bitline coupled to the local sensed output through the n-type transistor; and
    a voltage swing limiter coupled between the n-type transistor, the global bitline, and ground,
    wherein the gate of the n-type transistor is coupled to the local sensed output, the first terminal of the n-type transistor is coupled to the global bitline, and the second terminal of the n-type transistor is coupled to the voltage swing limiter.

18. The circuit design of claim 17, wherein the voltage swing limiter includes a transmission gate having a p-type device and an n-type device coupled between ground and the second terminal of the n-type transistor, a voltage swing detection circuit being coupled among the global bitline and the gate of the n-type transistor and the local sensed output.

19. The circuit design of claim 17, wherein the local sensed output is transmitted through a first stage sense amp.

20. The circuit design of claim 17, wherein the local bitline columns include one of a single bitline and a pair of differential bitlines.

* * * * *